(12) United States Patent
Shimonaka et al.

(10) Patent No.: US 8,513,631 B2
(45) Date of Patent: Aug. 20, 2013

(54) LIGHT PROCESSING APPARATUS

(75) Inventors: Masatoshi Shimonaka, Hyogo (JP); Keita Yoshihara, Hyogo (JP); Akinobu Nakashima, Hyogo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/432,403

(22) Filed: Mar. 28, 2012

(65) Prior Publication Data

US 2012/0248339 A1 Oct. 4, 2012

(30) Foreign Application Priority Data

Mar. 28, 2011 (JP) .................. 2011-069688

(51) Int. Cl.
*G03F 7/20* (2006.01)
*G03F 1/22* (2006.01)
*G03F 5/04* (2006.01)
*G03F 7/213* (2006.01)
*G03F 7/00* (2006.01)
*G03F 7/07* (2006.01)

(52) U.S. Cl.
CPC .............. *G03F 7/213* (2013.01); *G03F 7/201* (2013.01); *G03F 7/07* (2013.01); *G03F 7/0005* (2013.01)
USPC .......... 250/504 R; 250/493.1; 355/30; 355/67

(58) Field of Classification Search
CPC ........... G03F 7/201; G03F 7/213; G03F 7/05; G03F 7/0005; G03F 5/02

USPC .......................................... 250/504 R, 493.1
See application file for complete search history.

(56) References Cited

U.S. PATENT DOCUMENTS

| | | | | |
|---|---|---|---|---|
| 3,869,614 | A * | 3/1975 | Munk | 250/365 |
| 4,455,090 | A * | 6/1984 | Roberts | 356/448 |
| 5,393,980 | A * | 2/1995 | Yost et al. | 850/9 |
| 6,741,044 | B2 * | 5/2004 | Komori et al. | 315/308 |
| 6,847,012 | B1 * | 1/2005 | Hauf | 219/390 |
| 7,132,648 | B2 * | 11/2006 | Ratiff et al. | 250/252.1 |
| 7,211,372 | B2 * | 5/2007 | Park et al. | 430/321 |
| 7,248,332 | B2 * | 7/2007 | Owen | 355/30 |
| 7,292,320 | B2 * | 11/2007 | Takami | 356/30 |
| 8,010,222 | B2 * | 8/2011 | Lehman et al. | 700/121 |
| 8,295,691 | B2 * | 10/2012 | Kusuda | 392/418 |
| 8,358,069 | B2 * | 1/2013 | Sumitomo et al. | 313/635 |
| 8,399,869 | B2 * | 3/2013 | Rosier et al. | 250/504 R |
| 8,416,391 | B2 * | 4/2013 | Banine et al. | 355/67 |
| 2012/0223631 | A1 * | 9/2012 | Yoshihara et al. | 313/113 |
| 2012/0248339 | A1 * | 10/2012 | Shimonaka et al. | 250/492.1 |

FOREIGN PATENT DOCUMENTS

JP 2000-194142 A 7/2000

* cited by examiner

*Primary Examiner* — David A Vanore
(74) *Attorney, Agent, or Firm* — Rader, Fishman & Grauer PLLC

(57) ABSTRACT

A light processing apparatus irradiates an ultra violet light through a square or a rectangular light transmitting window onto a work piece that has a square or rectangular pattern formation portion. The apparatus includes a light emitting unit that comprises a casing, an ultraviolet irradiance lamp arranged inside the casing and the light transmitting window member provided in one face of the casing. One side of the light transmitting window and one side of the pattern formation portion are not parallel to each other.

10 Claims, 8 Drawing Sheets

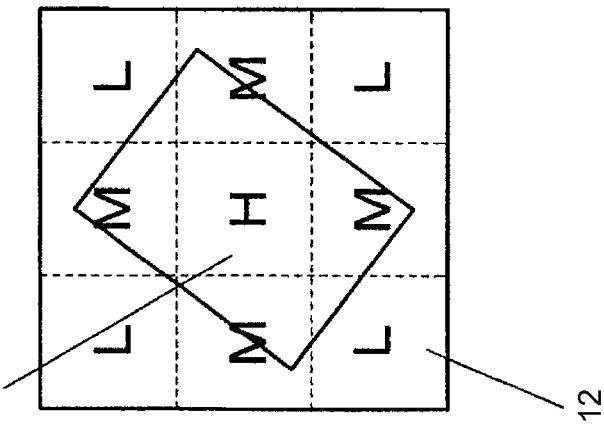
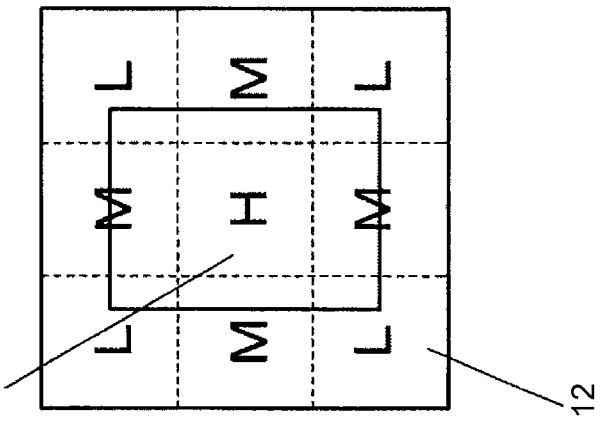

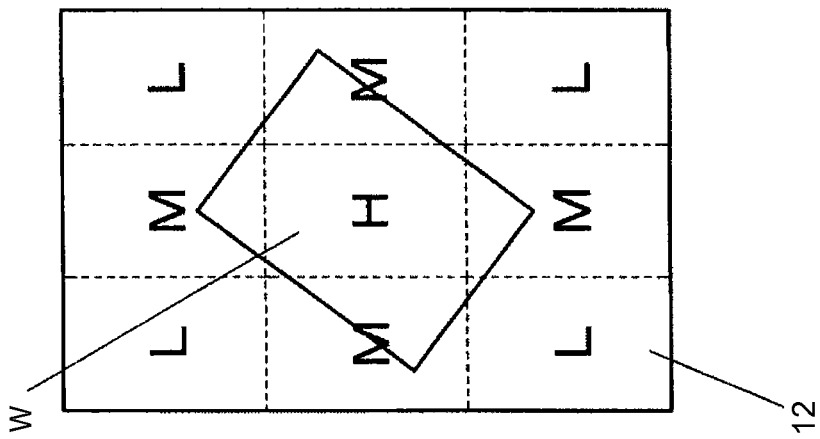
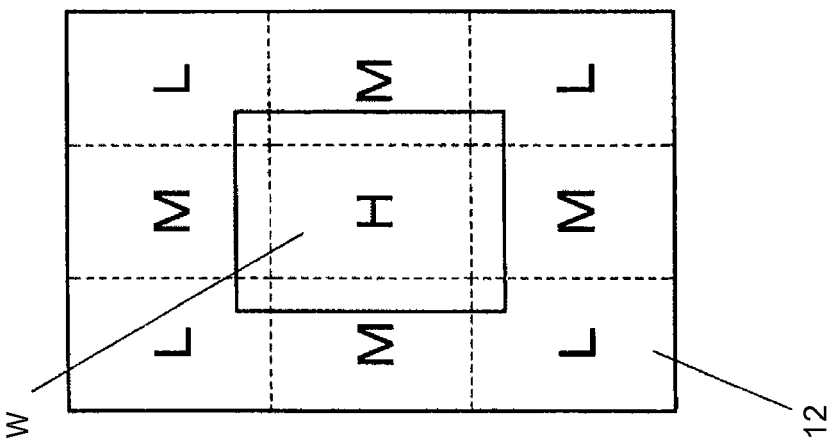

LIGHT PROCESSING APPARATUS

CROSS-REFERENCES TO RELATED APPLICATION

This application claims priority from Japanese Patent Application Serial No. 2011-069688 filed Mar. 28, 2011, the contents of which are incorporated herein by reference in their entirety.

TECHNICAL FIELD

The present invention relates to a light processing apparatus and, more particularly, to a light processing apparatus for performing dry cleaning processing of a surface of a template in a nanoimprinting apparatus.

BACKGROUND

In the field of manufacture of a semiconductor chip or a biochip, optical nanoimprint technology has attracted attention. This is because it is possible to manufacture those chips at low cost by such optical nanoimprinting, compared with a pattern formation method using a conventional photo lithography and etching. For example, Japanese Patent Application Publication No. 2000-194142 discloses such a method.

Although, in such optical nanoimprinting, a template is used to form a pattern on a workpiece to be processed, the template has to be frequently cleaned. This is because, in such nanoimprinting, the template is brought into direct contact with a resist, so that remnants of the resist adhere to the template every time a pattern is formed.

A wet cleaning method using an organic solvent or alkali chemical has been adopted as such a cleaning method of the template. However, in such a wet cleaning method, part of the template dissolves with the organic solvent, chemical, or the like, so that there is a possibility that the pattern shape thereof may change.

SUMMARY

The present invention relates to a light processing apparatus that includes a light emitting unit comprising a casing, an ultraviolet light irradiating lamp arranged in the casing and a square or rectangular light transmitting window. The lamp is configured to irradiate from the light emitting unit an ultraviolet light onto a work piece having an approximately rectangular (square or rectangular) pattern formation portion. The square or rectangular light transmitting window is provided in a face of the casing. One side of the window is configured not to be in parallel or perpendicular with one side of the pattern formation portion.

Further, the light transmitting window member and the approximately rectangular pattern formation portion may be squares, respectively. The one side of the window and one side of the pattern formation portion may intersect each other at 45 degrees.

A central line extending in a longitudinal direction of the lamp and the one side of the pattern formation portion may intersect each other. The work piece may be a template for nanoimprinting.

Furthermore, the ultraviolet irradiance lamp may be an excimer lamp having a pair of electrodes provided on an outer face of the excimer lamp.

BRIEF DESCRIPTION OF THE DRAWING

Other features and advantages of the present light processing apparatus will be apparent from the ensuing description, taken in conjunction with the accompanying drawings, in which:

FIGS. 6A-6B show the arrangement relation between the window member 11 and the workpiece W (pattern formation portion) respectively;
FIGS. 7A-7B show the arrangement relation between the window member 11 and the workpiece W (pattern formation portion) respectively.

DESCRIPTION

The present invention relates to a novel apparatus in which a template is not damaged in cleaning of a nanoimprint template.

Figure 8A:
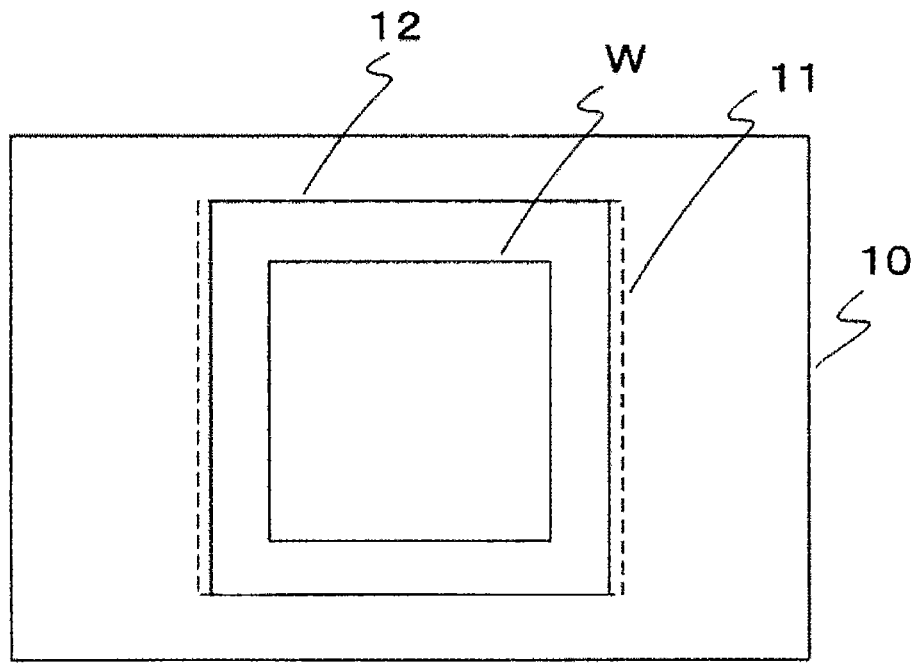
FIGS. 8A and 8B show the structure of an apparatus which serves as a base for the present invention.
Figure 8B:
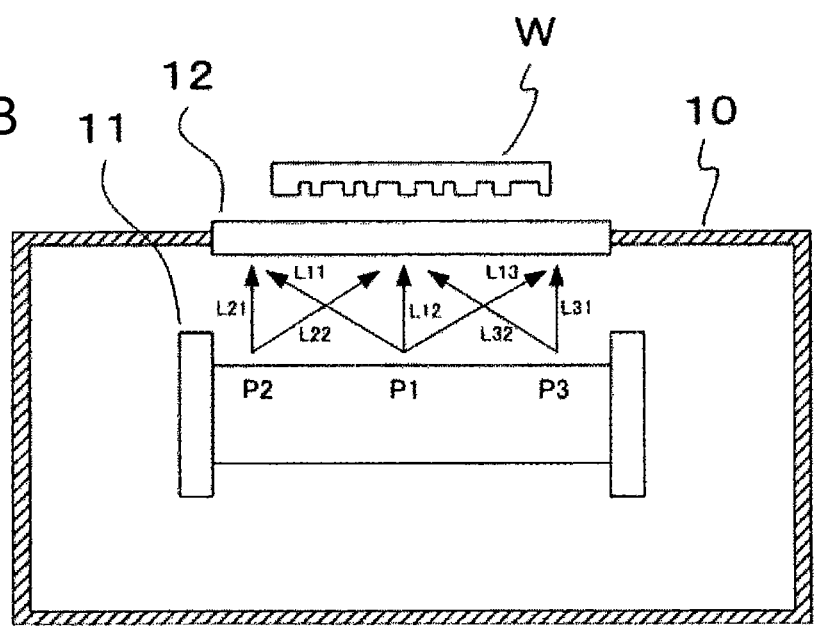

A subject matter of the present invention will be described in more detail below. FIGS. 8A and 8B show an apparatus (paper or document thereabout has not been published). FIG. 8A is a top plan view of the structure of the apparatus, and FIG. 8B shows the structure of the inside of the apparatus. An ultraviolet ray radiation lamp 11 (hereinafter referred to as a "lamp") is arranged inside a casing 10. A window member 12 is formed by attaching a light transmitting member such as silica glass to (an opening of) one face of the casing 10. A workpieces W, such as, a nanoimprint template is held right above the window member 12 by a holding member, which is not shown in the figures. The workpiece W is, for example, square in shape and similarly the window member 12 is also square in shape. As shown in FIG. 8A, when the workpiece W and the window member 12, which are stacked, are viewed, the workpiece W and the window member 12 are positioned so that any one side of the workpiece W does not intersect with any one side of the window member 12. That is, the diagonal lines of the work piece W and the window member 12 are overlap each other.

Figure 9:
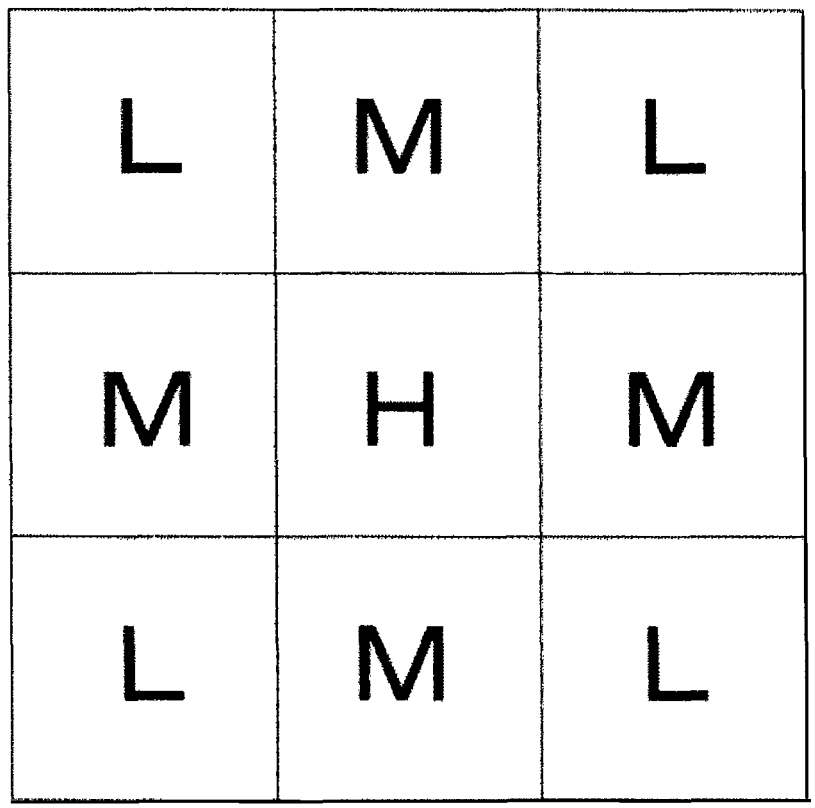
FIG. 9 shows irradiance distribution on a window member in the apparatus structure.

Ultraviolet rays emitted towards the workpiece W from the window member 12 vary in illuminance such that, the rays closer to the center of the window member 12 and that of the workpiece W have a higher illuminance, and the rays closer to the circumference thereof possess a lower illuminance. FIG. 9 shows the radiation illumination of the ultraviolet rays on the window member 12, where H represents an area where the illuminance is high, M represents an area where the illumination is a medium degree, and L represents an area where the illuminance is low. In addition, in the figure, although the window member is divided into nine regions and classified by these three levels, in fact, illuminance measurements gradually toward the circumference. The reason why the illuminance is higher closer to the center and the illuminance is lower closer to the circumference, is that, as shown in FIG. 8B, the window member 12 is irradiated with the radiation light rays L11, L12, and L13 from a position P1 on a lamp surface which is located almost right under the central point of the window member 12. On the other hand, as shown in the figure, the window member 12 is irradiated with the radiation light L21, L22, L31, and L32 respectively from a position P2 and a position P3, which are on the lamp surface located almost right under the circumference of the window member 12. For this reason, it is understood that radiation light received from the lamp 11 is lower as the circumference of the window member 12 I approached.

Of course, if the casing 10 is designed to be sufficiently large with respect to the workpiece W, that is, the light source lamp 11 or the window member 12 is designed to be larger than the size of the workpiece W, then the varying illuminance may be accounted for. However, since miniaturization is required in this kind of apparatus, it is improper to implement a case that is larger in size than needed. Similarly, the height of the casing 10 must be kept low, since the length of the radiation face and the window member 12 of the lamp 11 are in fact also low (for example, 30 mm).

Therefore, in view of such circumstances, the present invention relates to effectively use radiation light emitted from a window member 12, where a light source 11 and the window member 12 are configured as small as possible with respect to the size of a work piece W.

Detailed description of a light processing apparatus according to the present invention will be given below.

Figure 1:
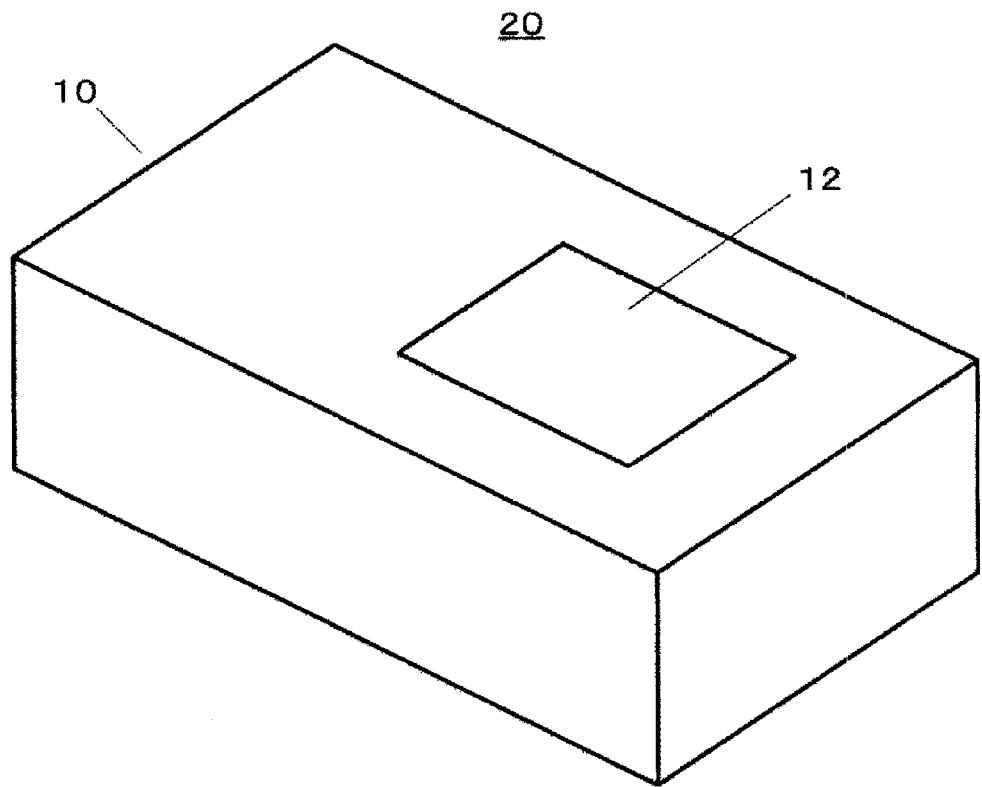
FIG. 1 shows a light processing apparatus.
Figure 2:
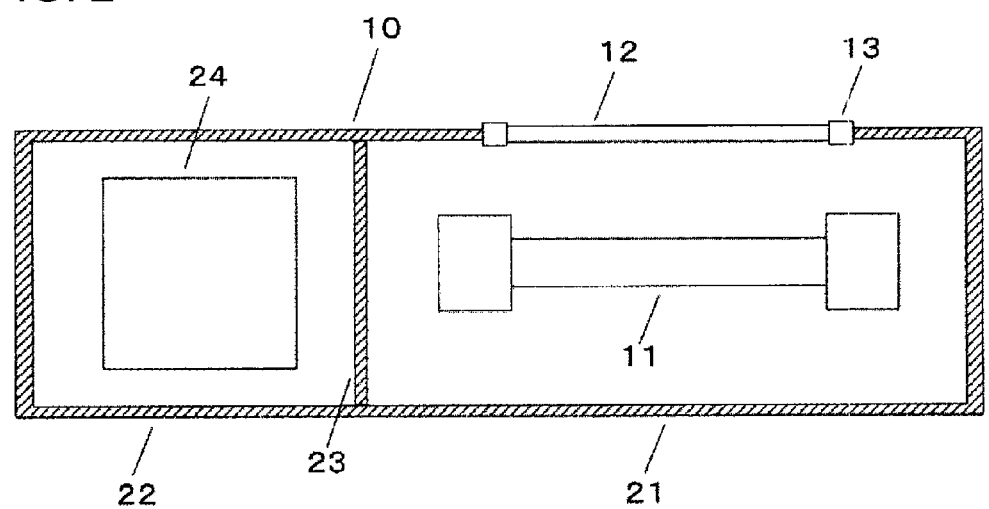
FIG. 2 shows a light processing apparatus.

FIG. 1 is a schematic view of a light source unit of the light processing apparatus. FIG. 2 is an explanatory cross sectional view of the light source unit. The light source unit 20 is used to clean, with light, a surface of a template (workpiece W), for example, in a nanoimprinting apparatus. The shape of entirety of the light source unit 20 is determined according to the casing 10, whose shape is approximately rectangular parallelepiped. A lamp housing chamber 21 and a power source housing chamber 22 are provided inside the casing 10 to be aligned through a dividing wall 23.

The window member 12, which is made of quartz glass, is fixed to part of a wall portion of the lamp housing chamber 21 of the casing 10 by a frame member 13. An ultraviolet ray radiation lamp 11 (hereinafter merely referred to as a "lamp") is arranged in the lamp housing chamber 21. A boosting transformer 24 for supplying electric power to the lamp 11 is arranged in the power source housing chamber 22. In addition, it is desirable that ultraviolet rays, especially vacuum ultraviolet rays, be emitted from the lamp 11. Therefore, an excimer lamp, that encloses xenon gas, is suitable for the lamp 11. In the case of such an excimer lamp, which requires high voltage, it is desirable in general that only the transformer 24 be installed near the lamp and that an inverter circuit and the like be separated from the lamp. In this embodiment, the inverter circuit is arranged outside the casing 10.

Figure 3:
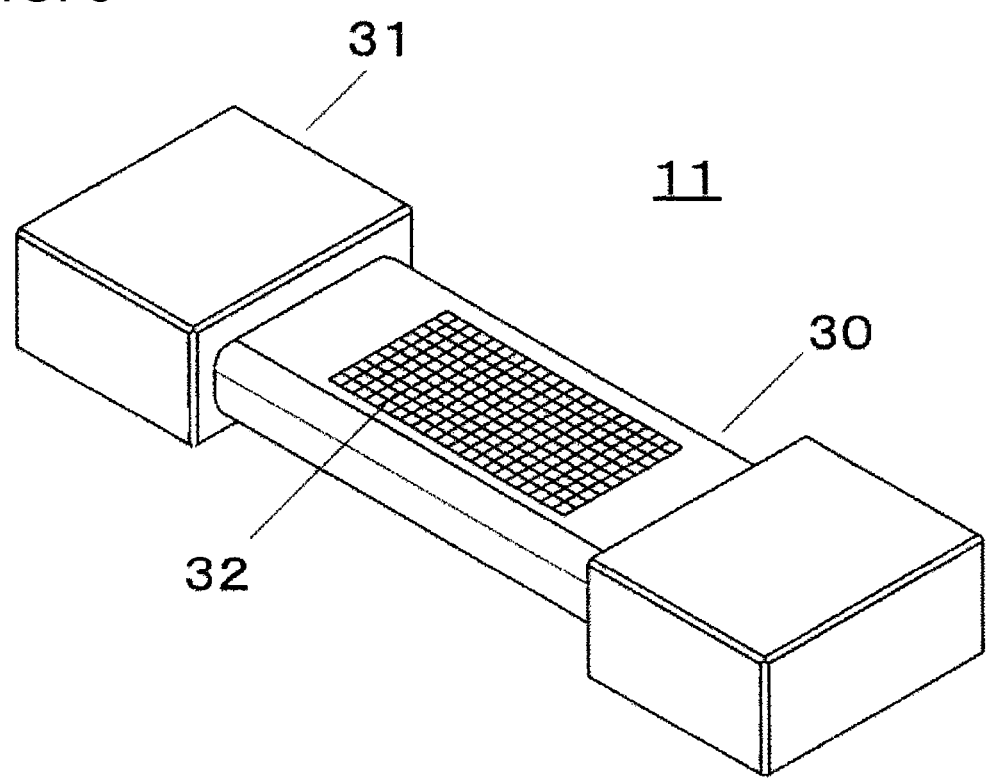
FIG. 3 shows an ultraviolet ray radiation lamp.

FIG. 3 shows an ultraviolet ray radiation lamp. Further, FIG. 3 shows an example of the ultraviolet ray radiation lamp 11 (i.e. an excimer lamp). The excimer lamp 11 has an electric discharge container 30, which has a flat shape as a whole, where an electrical discharge space is formed inside the electric discharge container. Mouthpieces 31 are provided at both ends of the electric discharge container 30, respectively. A pair of net shape electrodes 32 is formed on an outer face of the electric discharge container 30 by, for example, screen printing. The electric discharge container 30 is made of material, for example, quartz glass, which suitably transmits ultraviolet rays. In the electric discharge container 30, material, for example, rare gas (such as xenon, argon, krypton, or the like) or halogen gas (such as bromine, chlorine, iodine, or the like) in addition to the rare gas, which emits ultraviolet rays due to dielectric barrier discharge, is enclosed inside the electric discharge container 30. When xenon is used as the enclosed gas, the typical emission wavelength is 172 nm. When argon and iodine are used as the enclosed gas, the typical emission wavelength is 191 nm. When argon and fluorine are used as the enclosed gas, the typical emission wavelength is 193 nm. The enclosure pressure of the gas is 10–100 kPa.

In addition, the light source unit 10 is used for cleaning the template of a nanoimprinting apparatus. The structure of such apparatus is disclosed in Japanese Patent Application Serial No. 2010-16127 filed by the present assignee.

Next, description of arrangement relation between a window member 11 and a workpiece W will be given below. FIGS. 4A-7B show the arrangement relation between the window member 11 and the workpiece W (pattern formation portion) respectively. FIGS. 4A, 5A, 6A and 7A respectively show a conventional arrangement structure; FIGS. 4B, 5B, 6B and 7B respectively show an arrangement structure according to the present invention.

Figure 4B:
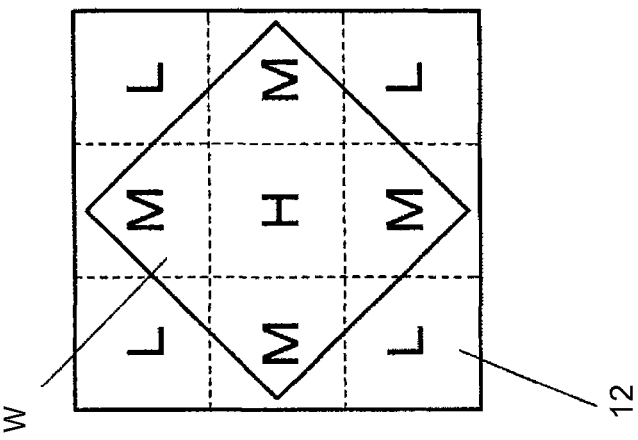
FIGS. 4A-4B show the arrangement relation between the window member 11 and the workpiece W (pattern formation portion) respectively.
Figure 4A:
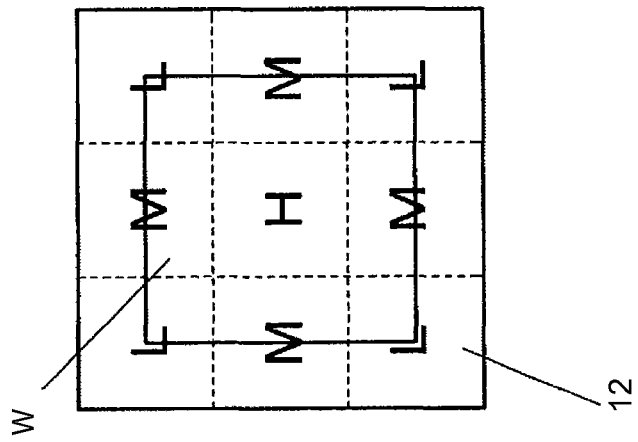

In FIGS. 4A and 4B, the window member 12 is a square and the workpiece W are square, where their relation is such that one of sides of the workpiece W and one of sides of the window member 12 are neither parallel nor perpendicular to each other so that they cross each other. In this arrangement, it turns out that portions (L regions) of the workpiece W receiving less ultraviolet ray radiation from the window member 12 become, as a whole, small. Especially, when both members are squares, if any one side of the workpiece W intersects any one of the sides of the window member 12 at 45 degrees, the usage efficiency of radiation amount can be raised by the simplest structure.

Figure 5B:
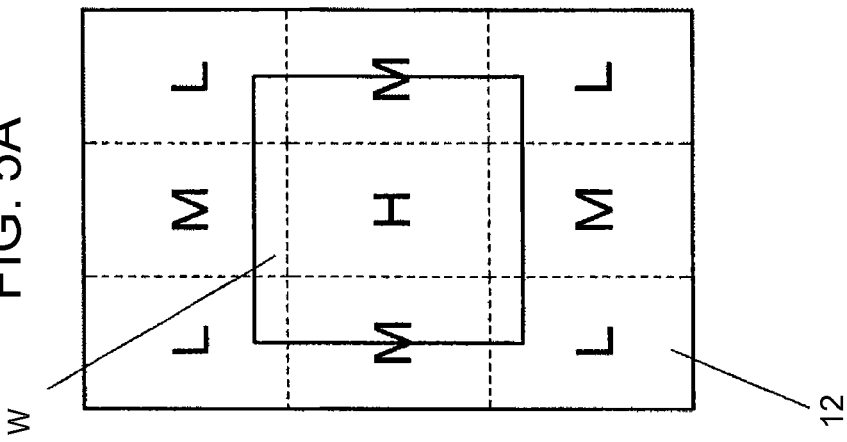
FIGS. 5A-5B show the arrangement relation between the window member 11 and the workpiece W (pattern formation portion) respectively.
Figure 5A:
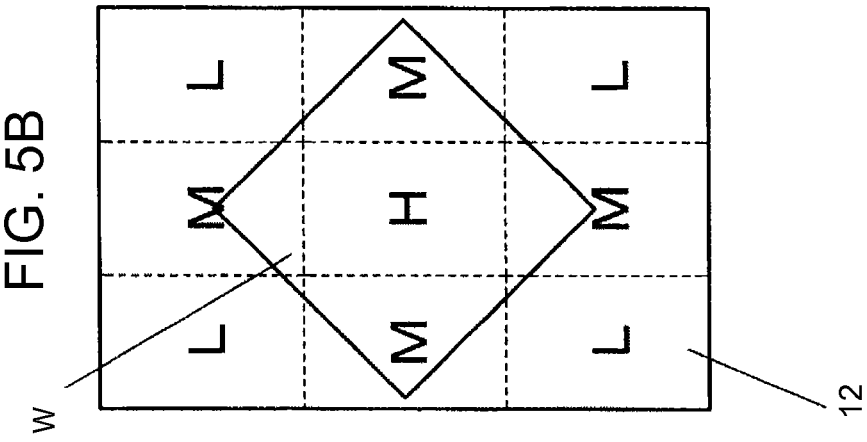

In FIGS. 5A and 5B, the window member 12 is a rectangle and the workpiece W is a square. In FIGS. 6A and 6B, the window member 12 is a square and the workpiece W is a rectangle. In FIGS. 7A and 7B, the window member 12 and the workpiece W are rectangles. Any of those cases are similar to the case of FIGS. 4A and 4B. That is, if any one of the sides of the workpiece W and any one of the sides of the window member 12 are neither parallel nor perpendicular to each other so they intersect, an area arranged in an L region of the workpiece W becomes small, so that the usage efficiency of radiation amount is raised. However, where either the window member 12 or the workpiece W is a rectangle does not mean that 45 degrees is optimal, is the optimal angle is decided according to the aspect ratio of the rectangle.

In addition, in the present invention, the rectangle (a square, a rectangle) means the shape of the pattern formation portion of the workpiece W. That is, for example, in case where there is a frame surrounding the pattern formation portion, the shape of the workpiece W excluding the frame surrounding the pattern formation portion is a rectangle. The present invention is based on the premise that the center of the window member 12 and that of the workpiece W overlap each other.

Also, in the present invention, various modifications and changes may be made. For example, the number of the ultraviolet ray radiation lamp is not limited to one, and two or more lamps may be arranged to form a light source unit. Moreover, the ultraviolet ray radiation lamp is not limited to such an excimer lamp, and a low pressure mercury lamp, an ultraviolet ray radiation LED, or the like may be used.

The preceding description has been presented only to illustrate and describe exemplary embodiments of the present light processing apparatus. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims.

The invention may be practiced otherwise than is specifically explained and illustrated without departing from its spirit or scope.

What is claimed is:

1. A light processing apparatus comprising:
   a light emitting unit comprising a casing, an ultraviolet light irradiating lamp arranged in the casing and a square or rectangular light transmitting window;
   the lamp is configured to irradiate an ultraviolet light onto a work piece through the window, the work piece comprises a square or rectangular pattern formation portion; and
   one side of the window is configured not to be in parallel or perpendicular with one side of the pattern formation portion.

2. The light processing apparatus according to claim 1, wherein both the one side of the window and the one side of the pattern formation portion intersect at 45 degrees.

3. The light processing apparatus according to claim 1, wherein a central line extending in a longitudinal direction of the lamp and the one side of pattern formation portion intersect each other.

4. The light processing apparatus according to claim 1, wherein the work piece is a nanoimprinting template.

5. The light processing apparatus according to claim 1, wherein the ultraviolet irradiance lamp is an excimer lamp comprising a pair of electrodes provided on an outer face of the excimer lamp.

6. A light processing method using the light processing apparatus according to claim 1 comprising the step of:
   irradiating an ultraviolet light onto the work piece through the window.

7. The light processing method according to claim 6, wherein both the one side of the window and the one side of the pattern formation portion intersect at 45 degrees.

8. The light processing method according to claim 6, wherein a central line extending in a longitudinal direction of the lamp and the one side of pattern formation portion intersect each other.

9. The light processing method according to claim 6, wherein the work piece is a nanoimprinting template.

10. The light processing method according to claim 6, wherein the ultraviolet irradiance lamp is an excimer lamp comprising a pair of electrodes provided on an outer face of the excimer lamp.

* * * * *